United States Patent
Matsuzawa et al.

(10) Patent No.: US 9,849,488 B2
(45) Date of Patent: Dec. 26, 2017

(54) UNIT CONTROL PANEL, SUBSTRATE TRANSFER TEST METHOD, AND SUBSTRATE PROCESSING APPARATUS

(71) Applicant: EBARA CORPORATION, Tokyo (JP)

(72) Inventors: Shunsuke Matsuzawa, Tokyo (JP); Masafumi Inoue, Tokyo (JP)

(73) Assignee: EBARA CORPORATION, Tokyo (JP)

(*) Notice: Subject to any disclaimer, the term of this patent is extended or adjusted under 35 U.S.C. 154(b) by 534 days.

(21) Appl. No.: 14/483,096

(22) Filed: Sep. 10, 2014

(65) Prior Publication Data
US 2015/0071742 A1  Mar. 12, 2015

(30) Foreign Application Priority Data

Sep. 11, 2013  (JP) .................................. 2013-188073

(51) Int. Cl.
| | |
|---|---|
| H01L 21/677 | (2006.01) |
| B24B 37/04 | (2012.01) |
| B08B 3/04 | (2006.01) |
| H01L 21/304 | (2006.01) |
| H01L 21/67 | (2006.01) |

(52) U.S. Cl.
CPC ................. B08B 3/04 (2013.01); B24B 37/04 (2013.01); H01L 21/67253 (2013.01); H01L 21/67259 (2013.01)

(58) Field of Classification Search
CPC ..... B08B 3/04; B24B 37/04; H01L 21/67253; H01L 21/67259
See application file for complete search history.

(56) References Cited

U.S. PATENT DOCUMENTS

| | | | | |
|---|---|---|---|---|
| 5,511,005 A * | 4/1996 | Abbe | ...................... | H01L 22/20 257/E21.525 |
| 6,137,303 A * | 10/2000 | Deckert | .............. | G01R 31/2831 324/757.03 |
| 6,832,863 B2 * | 12/2004 | Sugimoto | ........... | G03F 7/70691 396/611 |
| 7,701,236 B2 * | 4/2010 | Akiyama | ........... | G01R 31/2893 324/750.16 |
| 7,741,837 B2 * | 6/2010 | Obikane | .............. | G01R 31/2893 324/754.08 |
| 2002/0103556 A1 * | 8/2002 | Yasuda | .............. | G05B 19/4183 700/95 |

(Continued)

FOREIGN PATENT DOCUMENTS

| | | |
|---|---|---|
| JP | 2001-274119 | 10/2001 |
| JP | 2002-280279 A | 9/2002 |

*Primary Examiner* — Charles Kasenge
(74) *Attorney, Agent, or Firm* — Baker & Hostetler LLP

(57) ABSTRACT

It is an object of the embodiment of the invention to enhance the work efficiency of a substrate transfer test between a plurality of units. A test control section (CPU) which is provided in a loading/unloading unit 2 performs a substrate transfer test for the loading/unloading unit 2 alone by receiving a wafer mounted on a substrate table 2300 or 2400 which is installed outside the loading/unloading unit 2 and transporting the wafer into the loading/unloading unit 2 by a transport mechanism or transporting a wafer placed in the loading/unloading unit 2 to a substrate table 2200 and mounting the wafer on the substrate table 2200 by the transport mechanism while the loading/unloading unit 2 is not assembled together with the cleaning unit and the polishing unit.

20 Claims, 12 Drawing Sheets

(56) References Cited

U.S. PATENT DOCUMENTS

| | | | | |
|---|---|---|---|---|
| 2004/0005149 A1* | 1/2004 | Sugimoto | ............ | G03F 7/70691 |
| | | | | 396/564 |
| 2004/0045668 A1* | 3/2004 | Iwasaki | ............. | H01L 21/67271 |
| | | | | 156/345.31 |
| 2004/0092069 A1 | 5/2004 | Ishii et al. | | |
| 2005/0045821 A1* | 3/2005 | Noji | ..................... | G01N 23/225 |
| | | | | 250/311 |
| 2008/0284455 A1* | 11/2008 | Obikane | ............ | G01R 31/2893 |
| | | | | 324/754.08 |
| 2008/0290886 A1* | 11/2008 | Akiyama | ............ | G01R 31/2893 |
| | | | | 324/750.16 |
| 2012/0271444 A1* | 10/2012 | Matsumoto | ........ | H01L 21/67276 |
| | | | | 700/100 |

* cited by examiner

UNIT CONTROL PANEL, SUBSTRATE TRANSFER TEST METHOD, AND SUBSTRATE PROCESSING APPARATUS

CROSS-REFERENCE TO RELATED APPLICATION

This application is based upon and claims the benefit of priority of the prior Japanese Patent Application No. 2013-188073, filed on Sep. 11, 2013, the entire contents of which are incorporated herein by reference.

TECHNICAL FIELD

The present invention relates to a unit control panel, a substrate transfer test method, and a substrate processing apparatus.

BACKGROUND ART

In recent years, a substrate processing apparatus has been used to perform various types of types of processes on a substrate, such as a semiconductor wafer. The substrate processing apparatus includes, for example, a polishing unit for performing substrate polishing processing, a cleaning unit for performing substrate cleaning processing and drying processing, and a loading/unloading unit for performing substrate transport processing.

The polishing unit, the cleaning unit, and the loading/unloading unit are manufactured independently of one another. After the plurality of units are assembled into the substrate processing apparatus, the substrate processing apparatus generally performs a series of processes on a substrate with the substrate transferred between the plurality of units. That is, the loading/unloading unit loads (passes) a substrate to be processed into (to) the polishing unit. The polishing unit performs polishing processing on the substrate loaded by the loading/unloading unit. The cleaning unit receives the substrate subjected to the polishing processing by the polishing unit and performs cleaning processing and drying processing. The loading/unloading unit unloads (receives) the substrate dried by the cleaning unit.

It is common for a substrate processing apparatus not to start full-scale operation shortly after assembly of a plurality of units into the substrate processing apparatus but to first perform startup work (test operation) of the substrate processing apparatus. Examples of the startup work include a test of whether processing is appropriately performed in each unit and a test of whether transfer of a substrate is appropriately performed between a plurality of units.

CITATION LIST

Patent Literature

Patent Literature 1: Japanese Patent Laid-Open No. 2001-274119

SUMMARY OF THE INVENTION

Technical Problem

No regard is given to enhancement of the work efficiency of a substrate transfer test between a plurality of units in the related art.

In order to perform a substrate transfer test between a plurality of units, a unit on the substrate passing side and a unit on the substrate receiving side are basically necessary. For this reason, in the related art, a substrate transfer test between units is generally performed after a substrate processing apparatus is manufactured by assembling the plurality of units together.

However, a substrate processing apparatus manufactured through assembly of a plurality of units is large in size and requires a long time for a substrate transfer test. This may result in the difficulty of enhancing the efficiency of a substrate transfer test.

Under the circumstances, an example of an object of the present invention is to enhance the working efficiency of a substrate transfer test between a plurality of units.

Solution to Problem

A unit control panel according to one aspect of the present invention, which has been made in view of the above object, is a unit control panel provided in at least one of units of a substrate processing apparatus, the substrate processing apparatus processing a substrate with transferring the substrate between the units assembled together, comprising a test control section configured to perform a substrate transfer test for a unit provided with the unit control panel using a substrate table which is installed outside the unit while the unit is not assembled together with another unit.

The test control section performs the substrate transfer test by transporting the substrate placed in the unit to the substrate table and mounting the substrate on the substrate table by a substrate transport mechanism which is provided in the unit or receiving the substrate mounted on the substrate table and transporting the substrate into the unit by the transport mechanism.

The substrate table is installed for the substrate transfer test at a location where a substrate transfer section of another unit which is used at a time of transfer of the substrate between the unit and another unit is located when the unit and another unit are assembled together.

The substrate processing apparatus includes a polishing unit configured to polish the substrate and mount the polished substrate on a temporary table, and a cleaning unit configured to clean and dry the substrate mounted on the temporary table, and the unit control panel is provided in the cleaning unit. In this case, the substrate table is installed for the substrate transfer test instead of the temporary table at a location where the temporary table is located when the polishing unit and the cleaning unit are assembled together, and the test control section of the unit control panel provided in the cleaning unit performs the substrate transfer test by receiving the substrate mounted on the substrate table and transporting the substrate into the cleaning unit by a substrate transport mechanism which is provided in the cleaning unit.

The substrate processing apparatus includes a polishing unit configured to polish the substrate, a cleaning unit configured to clean and dry the substrate polished by the polishing unit, and a loading/unloading unit configured to load the substrate onto a lifter in the polishing unit and unload the substrate mounted on a substrate drying module in the cleaning unit, and the unit control panel is provided in the loading/unloading unit. In this case, the substrate table is installed for the substrate transfer test instead of the lifter at a location where the lifter is located when the polishing unit and the loading/unloading unit are assembled together and is installed for the substrate transfer test instead of the drying module at a location where the drying module is located when the cleaning unit and the loading/unloading unit are assembled together, and the test control section of the unit control panel provided in the loading/unloading unit performs the substrate transfer test by transporting the substrate placed in the loading/unloading unit to the substrate table and mounting the substrate on the substrate table by a substrate transport mechanism which is provided in the loading/unloading unit and receiving the substrate mounted on the substrate table and transporting the substrate into the loading/unloading unit by the transport mechanism.

A substrate transfer test method according to one aspect of the present invention, which has been made in view of the above object, is a substrate transfer test method in at least one of units of a substrate processing apparatus, the substrate processing apparatus processing a substrate with transferring the substrate between the units assembled together, comprising: installing a substrate table outside the at least one unit while the at least one unit is not assembled together with another unit; and performing a substrate transfer test for the at least one unit using the substrate table.

The substrate transfer test is performed by transporting the substrate placed in the at least one unit to the substrate table and mounting the substrate on the substrate table by a substrate transport mechanism which is provided in the at least one unit or receiving the substrate mounted on the substrate table and transporting the substrate into the at least one unit by the transport mechanism.

The substrate table is installed for the substrate transfer test at a location where a substrate transfer section of another unit which is used at a time of transfer of the substrate between the unit and another unit is located when the unit and another unit are assembled together.

If the substrate processing apparatus includes a polishing unit configured to polish the substrate and mount the polished substrate on a temporary table and a cleaning unit configured to clean and dry the substrate mounted on the temporary table, and the substrate transfer test is performed in the cleaning unit, the substrate table is installed for the substrate transfer test instead of the temporary table at a location where the temporary table is located when the polishing unit and the cleaning unit are assembled together, and the substrate transfer test is performed by receiving the substrate mounted on the substrate table and transporting the substrate into the cleaning unit by a substrate transport mechanism which is provided in the cleaning unit.

If the substrate processing apparatus includes a polishing unit configured to polish the substrate, a cleaning unit configured to clean and dry the substrate polished by the polishing unit, and a loading/unloading unit configured to load the substrate onto a lifter in the polishing unit and unload the substrate mounted on a substrate drying module in the cleaning unit, and the substrate transfer test is performed in the loading/unloading unit, the substrate table is installed for the substrate transfer test instead of the lifter at a location where the lifter is located when the polishing unit and the loading/unloading unit are assembled together and is installed for the substrate transfer test instead of the drying module at a location where the drying module is located when the cleaning unit and the loading/unloading unit are assembled together, and the substrate transfer test is performed by transporting the substrate placed in the loading/unloading unit to the substrate table installed instead of the lifter and mounting the substrate on the substrate table by a substrate transport mechanism which is provided in the loading/unloading unit and receiving the substrate mounted on the substrate table installed instead of the drying module and transporting the substrate into the loading/unloading unit by the transport mechanism.

A substrate processing apparatus according to one aspect of the present invention, which has been made in view of the above object, is a substrate processing apparatus for processing a substrate, comprising: at least one unit which is each provided with a unit control panel, the unit including a test control section configured to perform a substrate transfer test for the unit using a substrate table which is installed outside the unit while the unit is not assembled together with another unit; and another unit which is to be assembled together with the unit, wherein the substrate processing apparatus processes a substrate and transfers the substrate between the unit and another unit assembled together.

According to one aspect, in the substrate processing apparatus, the test control section performs the substrate transfer test by transporting the substrate placed in the unit to the substrate table and mounting the substrate on the substrate table by a substrate transport mechanism which is provided in the unit or receiving the substrate mounted on the substrate table and transporting the substrate into the unit by the transport mechanism.

According to one aspect, in the substrate processing apparatus, the substrate table is installed for the substrate transfer test at a location where a substrate transfer section of another unit which is used at a time of transfer of the substrate between the unit and another unit is located when the unit and another unit are assembled together.

According to one aspect, in the substrate processing apparatus, the substrate processing apparatus comprises a polishing unit configured to polish the substrate and mount the polished substrate on a temporary table, and a cleaning unit configured to clean and dry the substrate mounted on the temporary table, and the unit control panel is provided in the cleaning unit, the substrate table is installed for the substrate transfer test instead of the temporary table at a location where the temporary table is located when the polishing unit and the cleaning unit are assembled together, and the test control section of the unit control panel provided in the cleaning unit performs the substrate transfer test by receiving the substrate mounted on the substrate table and transporting the substrate into the cleaning unit by a substrate transport mechanism which is provided in the cleaning unit.

According to one aspect, in the substrate processing apparatus, the substrate processing apparatus comprises a polishing unit configured to polish the substrate, a cleaning unit configured to clean and dry the substrate polished by the polishing unit, and a loading/unloading unit configured to load the substrate onto a lifter in the polishing unit and unload the substrate mounted on a substrate drying module in the cleaning unit, and the unit control panel is provided in the loading/unloading unit, the substrate table is installed for the substrate transfer test instead of the lifter at a location where the lifter is located when the polishing unit and the loading/unloading unit are assembled together and is installed for the substrate transfer test instead of the drying module at a location where the drying module is located when the cleaning unit and the loading/unloading unit are assembled together, and the test control section of the unit control panel provided in the loading/unloading unit performs the substrate transfer test by transporting the substrate placed in the loading/unloading unit to the substrate table and mounting the substrate on the substrate table by a substrate transport mechanism which is provided in the loading/unloading unit and receiving the substrate mounted on the substrate table and transporting the substrate into the loading/unloading unit by the transport mechanism.

Advantageous Effects of Invention

According to the present invention, the work efficiency of a substrate transfer test between a plurality of units can be enhanced.

DESCRIPTION OF EMBODIMENT

A unit control panel, a substrate transfer test method, and a substrate processing apparatus according to one embodiment of the present invention will be described below with reference to the drawings. Although an apparatus including a polishing unit, a cleaning unit, and a loading/unloading unit will be described below as an example of the substrate processing apparatus, the present invention is not limited to this. An example will be described below in which a substrate transfer test is performed in a cleaning unit and in a loading/unloading unit, and the present invention is also not limited to this.

The configuration of the substrate processing apparatus and transfer of a substrate between units of the substrate processing apparatus will be described first, and a substrate transfer test in each unit will be described later.

<Substrate Processing Apparatus>

Figure 1:
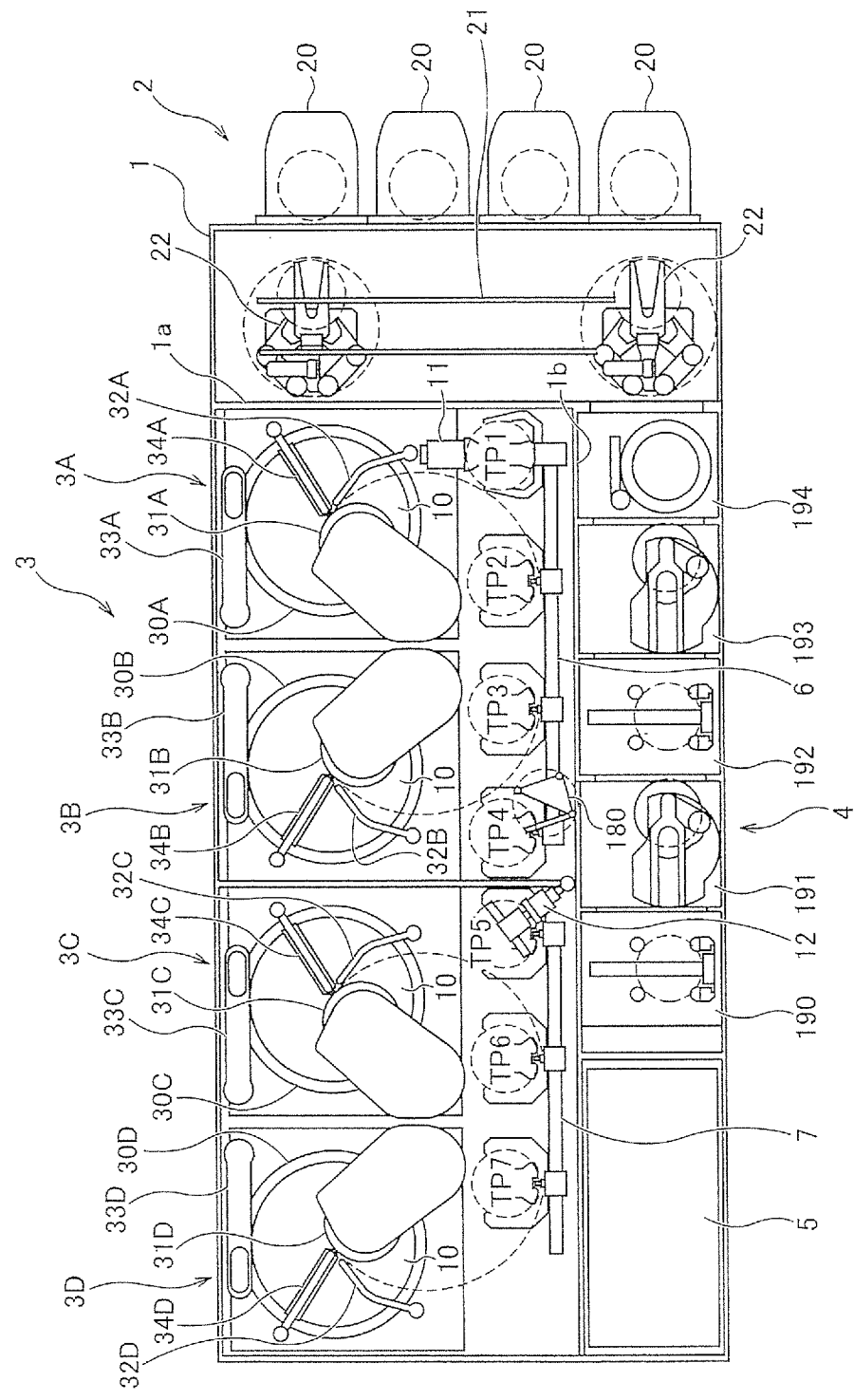
FIG. 1 is a plan view showing the overall configuration of a substrate processing apparatus according to the present embodiment.

FIG. 1 is a plan view showing the overall configuration of the substrate processing apparatus according to the one embodiment of the present invention. As shown in FIG. 1, the substrate processing apparatus includes a generally rectangular housing 1. The interior of the housing 1 is partitioned into a loading/unloading unit 2, a polishing unit 3, and a cleaning unit 4 with partitions 1a and 1b. The loading/unloading unit 2, the polishing unit 3, and the cleaning unit 4 are assembled independently of one another and are evacuated independently. The cleaning unit 4 has a control section 5 which controls substrate processing operation. The control section 5 includes a unit control panel (power supply panel).

<Loading/Unloading Unit>

The loading/unloading unit 2 includes two or more (four in the present embodiment) front loading sections 20, on which a wafer cassette storing a large number of wafers (substrates) is to be mounted. The front loading sections 20 are arranged adjacent to the housing 1 and disposed along a width direction (a direction perpendicular to a longitudinal direction) of the substrate processing apparatus. An open cassette, an SMIF (Standard Manufacturing Interface) pod, or a FOUP (Front Open Unified Pod) can be mounted on the front loading section 20. An SMIF pod and a FOUP are each a closed container which stores a wafer cassette and can maintain an environment independent of an outside space by being covered with confining walls.

A traveling mechanism 21 is laid along the row of front loading sections 20 in the loading/unloading unit 2. Two transport robots (loaders or transport mechanisms) 22 which are movable along a wafer cassette disposition direction are installed on the traveling mechanism 21. The transport robot 22 can gain access to a wafer cassette mounted on the front loading section 20 by moving on the traveling mechanism 21. Each transport robot 22 includes two upper and lower hands. The transport robot 22 uses the upper hand to return a processed wafer to a wafer cassette and uses the lower hand to take out a wafer to be processed from a wafer cassette. As described above, each transport robot 22 can properly use the upper and lower hands. The lower hand of the transport robot 22 can invert a wafer by rotating about a shaft center thereof.

The loading/unloading unit 2 is a region where the cleanest state needs to be maintained. For this reason, the interior of the loading/unloading unit 2 is always kept at a pressure higher than any of the pressure on the outside of the substrate processing apparatus, the pressure in the polishing unit 3, and the pressure in the cleaning unit 4. The polishing unit 3 uses slurry as a polishing solution and is the dirtiest region. Thus, a negative pressure is generated inside the polishing unit 3, and the pressure thereof is kept lower than the internal pressure of the cleaning unit 4. A filter fan unit (not shown) having a clean air filter, such as a HEPA filter, an ULPA filter, or a chemical filter, is provided in the loading/unloading unit 2. Clean air cleared of particles, toxic vapor, and toxic gas is always emanating from the filter fan unit.

<Polishing Unit>

The polishing unit 3 is a region where wafer polishing (planarization) is performed and includes a first polishing unit 3A, a second polishing unit 3B, a third polishing unit 3C, and a fourth polishing unit 3D. As shown in FIG. 1, the first polishing unit 3A, the second polishing unit 3B, the third polishing unit 3C, and the fourth polishing unit 3D are disposed along the longitudinal direction of the substrate processing apparatus.

As shown in FIG. 1, the first polishing unit 3A includes a polishing table 30A to which a polishing pad 10 having a polishing surface is attached, a top ring 31A for polishing a wafer while holding the wafer and pressing the wafer against the polishing pad 10 on the polishing table 30A, a polishing solution supply nozzle 32A for supplying a polishing solution or a dressing solution (e.g., pure water) to the polishing pad 10, a dresser 33A for dressing the polishing surface of the polishing pad 10, and an atomizer 34A for atomizing a fluid mixture of a liquid (e.g., pure water) and a gas (e.g., nitrogen gas) or a liquid (e.g., pure water) and spraying the fluid mixture or the liquid on the polishing surface.

Similarly, the second polishing unit 3B includes a polishing table 30B, to which the polishing pad 10 is attached, a top ring 31B, a polishing solution supply nozzle 32B, a dresser 33B, and an atomizer 34B. The third polishing unit 3C includes a polishing table 30C, to which the polishing pad 10 is attached, a top ring 31C, a polishing solution supply nozzle 32C, a dresser 33C, and an atomizer 34C. The fourth polishing unit 3D includes a polishing table 30D, to which the polishing pad 10 is attached, a top ring 31D, a polishing solution supply nozzle 32D, a dresser 33D, and an atomizer 34D.

The first polishing unit 3A, the second polishing unit 3B, the third polishing unit 3C, and the fourth polishing unit 3D have the same configuration. The first polishing unit 3A will be described below.

Figure 2:
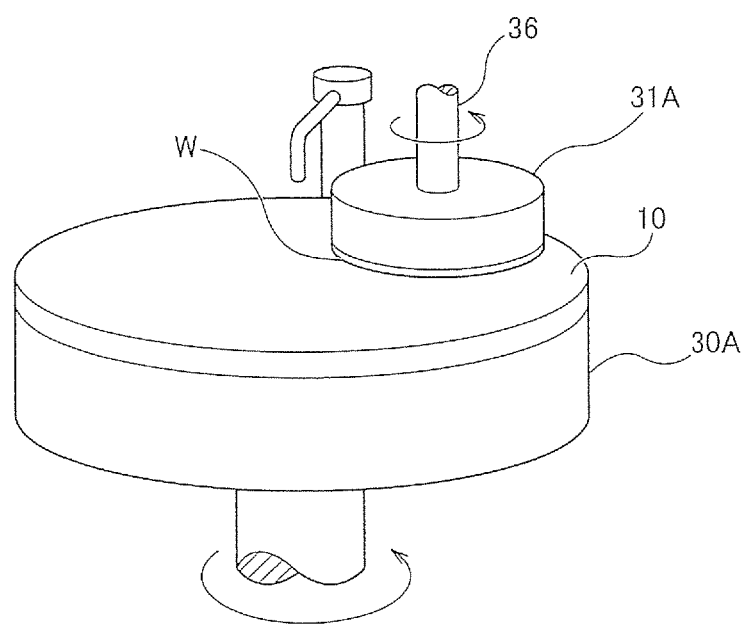
FIG. 2 is a perspective view schematically showing a polishing unit.

FIG. 2 is a perspective view schematically showing the first polishing unit 3A. The top ring 31A is supported on a top ring shaft 36. The polishing pad 10 is pasted to an upper surface of the polishing table 30A. An upper surface of the polishing pad 10 constitutes a polishing surface to polish a wafer W. Note that fixed abrasive grains can be used instead of the polishing pad 10. The top ring 31A and the polishing table 30A are each configured to rotate about a shaft center thereof, as indicated by arrows. The wafer W is held to a lower surface of the top ring 31A by vacuum suction. At the time of polishing, a polishing solution is supplied from the polishing solution supply nozzle 32A to the polishing surface of the polishing pad 10, and the wafer W as an object to be polished is pressed against the polishing surface by the top ring 31A and is polished.

A transport mechanism for transporting a wafer will be described. As shown in FIG. 1, a first linear transporter 6 is arranged adjacent to the first polishing unit 3A and the second polishing unit 3B. The first linear transporter 6 is a mechanism for transporting a wafer between four transport positions (a first transport position TP1, a second transport position TP2, a third transport position TP3, and a fourth transport position TP4 in order from the loading/unloading unit side) along a direction in which the polishing units 3A and 3B are disposed.

A second linear transporter 7 is arranged adjacent to the third polishing unit 3C and the fourth polishing unit 3D. The second linear transporter 7 is a mechanism for transporting a wafer between three transport positions (a fifth transport position TP5, a sixth transport position TP6, and a seventh transport position TP7 in order from the loading/unloading side) along a direction in which the polishing units 3C and 3D are disposed.

A wafer is transported to the polishing units 3A and 3B by the first linear transporter 6. The top ring 31A of the first polishing unit 3A moves between a polishing position and the second transport position TP2 by a swing action of a top ring head. Thus, transfer of a wafer to the top ring 31A is performed at the second transport position TP2. Similarly, the top ring 31B of the second polishing unit 3B moves between a polishing position and the third transport position TP3. Transfer of a wafer to the top ring 31B is performed at the third transport position TP3. The top ring 31C of the third polishing unit 3C moves between a polishing position and the sixth transport position TP6. Transfer of a wafer to the top ring 31C is performed at the sixth transport position TP6. The top ring 31D of the fourth polishing unit 3D moves between a polishing position and the seventh transport position TP7. Transfer of a wafer to the top ring 31D is performed at the seventh transport position TP7.

A lifter 11 for receiving a wafer from the transport robot 22 is arranged at the first transport position TP1. A wafer is passed from the transport robot 22 to the first linear transporter 6 via the lifter 11. The partition 1a is provided with a shutter (not shown) located between the lifter 11 and the transport robot 22. At the time of transport of a wafer, the shutter is opened, and the wafer is passed from the transport robot 22 to the lifter 11. A swing transporter 12 is arranged between the first linear transporter 6, the second linear transporter 7, and the cleaning unit 4. The swing transporter 12 has a hand which is movable between the fourth transport position TP4 and the fifth transport position TP5. Transfer of a wafer from the first linear transporter 6 to the second linear transporter 7 is performed by the swing transporter 12. A wafer is transported to the third polishing unit 3C and/or the fourth polishing unit 3D by the second linear transporter 7. A wafer polished in the polishing unit 3 is transported to the cleaning unit 4 via the swing transporter 12.

Figure 3:
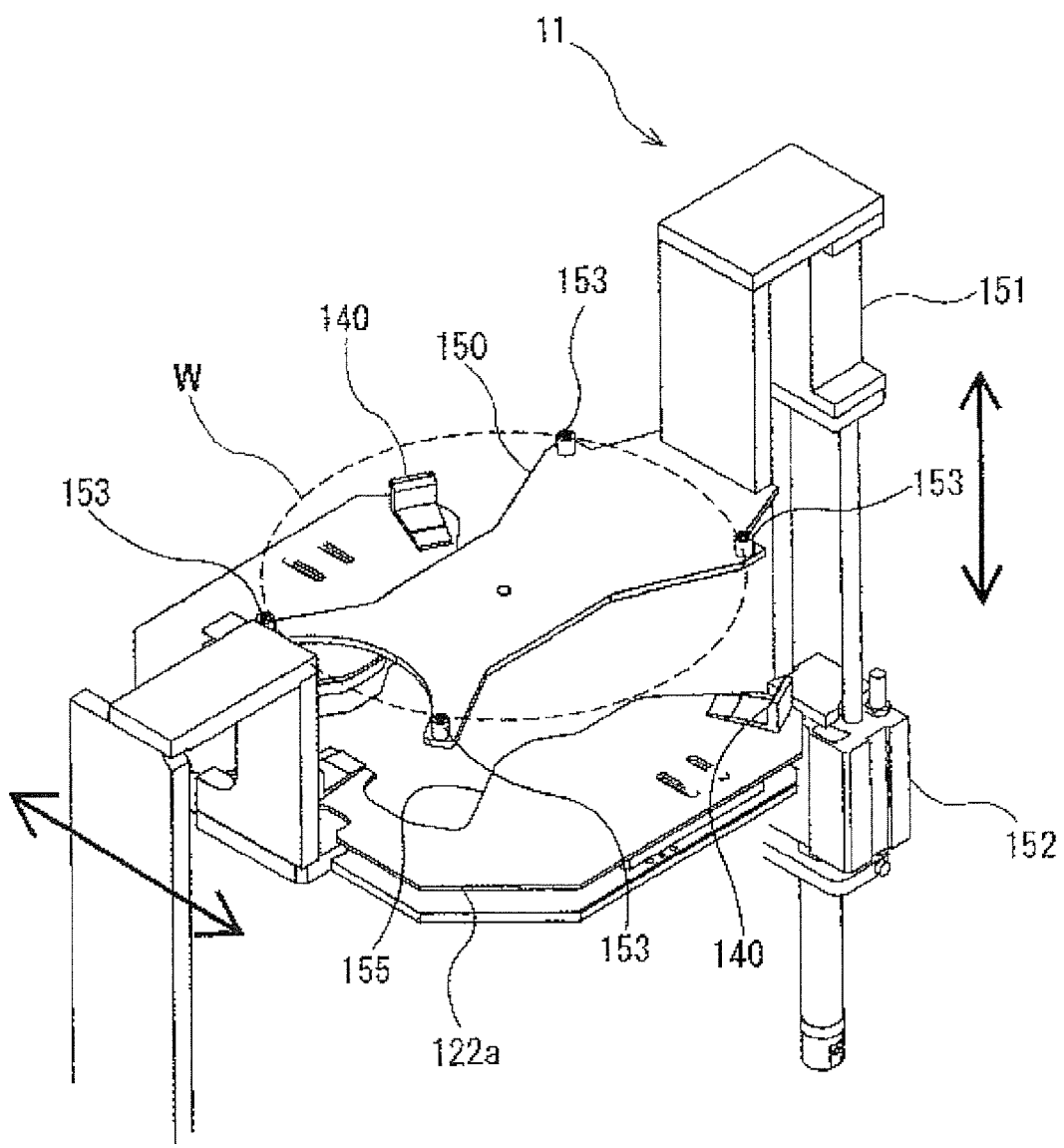
FIG. 3 is a perspective view showing the structure of a lifter.

FIG. 3 is a perspective view showing the structure of the lifter 11. The lifter 11 is arranged at a position to which arms of the transport robot 22 (see FIG. 1) can gain access. The lifter 11 includes a mounting stage 150 on which a wafer is to be mounted, a support shaft 151 which supports the mounting stage 150, and a lift drive mechanism 152 which vertically moves the mounting stage 150. A motor drive mechanism including a ball screw, an air cylinder, or the like is used as the lift drive mechanism 152. The mounting stage 150 is located at the first transport position TP1. Four pins 153 are provided on an upper surface of the mounting stage 150. A wafer W is mounted on the pins 153. The lower arm of the transport robot 22 inverts a wafer by rotating by 180° about a shaft center thereof and then mounts the wafer on the mounting stage 150 of the lifter 11. FIG. 3 shows an inverted wafer W. In the present embodiment, the arm of the transport robot 22 also functions as an inverting machine, which eliminates the need for a previously required inverting machine. Thus, a step of inverting a wafer W after the lifter 11 receives the wafer W can be omitted, which allows increase in the throughput for the entire processing.

A transport stage 122a of the first linear transporter 6 at the first transport position TP1 and the mounting stage 150 of the lifter 11 are disposed along the same vertical axis. As shown in FIG. 3, the transport stage 122a and the mounting stage 150 have shapes which do not overlap with each other when viewed from a vertical direction. More specifically, the transport stage 122a of the first linear transporter 6 has a notch 155 for letting the mounting stage 150 of the lifter 11 pass through. The notch 155 is formed to be slightly larger than the mounting stage 150.

The lifter 11 receives a wafer W inverted by the arm of the transport robot 22 at a position to which the mounting stage 150 is elevated. After that, the mounting stage 150 is driven by the lift drive mechanism 152 to descend. When the mounting stage 150 passes by the transport stage 122a of the first linear transporter 6, only the wafer W is mounted on the transport stage 122a. The mounting stage 150 continues to descend to a predetermined stop position. With this descent, the wafer W is passed from the lifter 11 to the first linear transporter 6. Since the arm of the transport robot 22 also functions as an inverting machine in the present embodiment, the need for a previously required inverting machine can be eliminated. The number of transfers of a wafer when the wafer is transported from the transport robot 22 to the first linear transporter 6 can thus be reduced. As a result, improper wafer transfers and a transfer time can be reduced.

The support shaft 151 of the lifter 11 has an inverted L-shape, and a vertical portion of the support shaft 151 is located outside the mounting stage 150. That is, the mounting stage 150 and the vertical portion of the support shaft 151 are located at positions which do not overlap with each other when the lifter 11 is viewed from the vertical direction.

Additionally, the support shaft 151 is located off a course of the transport stage 122a of the first linear transporter 6. Thus, the transport stage 122a of the first linear transporter 6 can arrive at the first transport position TP1, regardless of the vertical position of the mounting stage 150 of the lifter 11. This allows increase in throughput.

Figure 4:
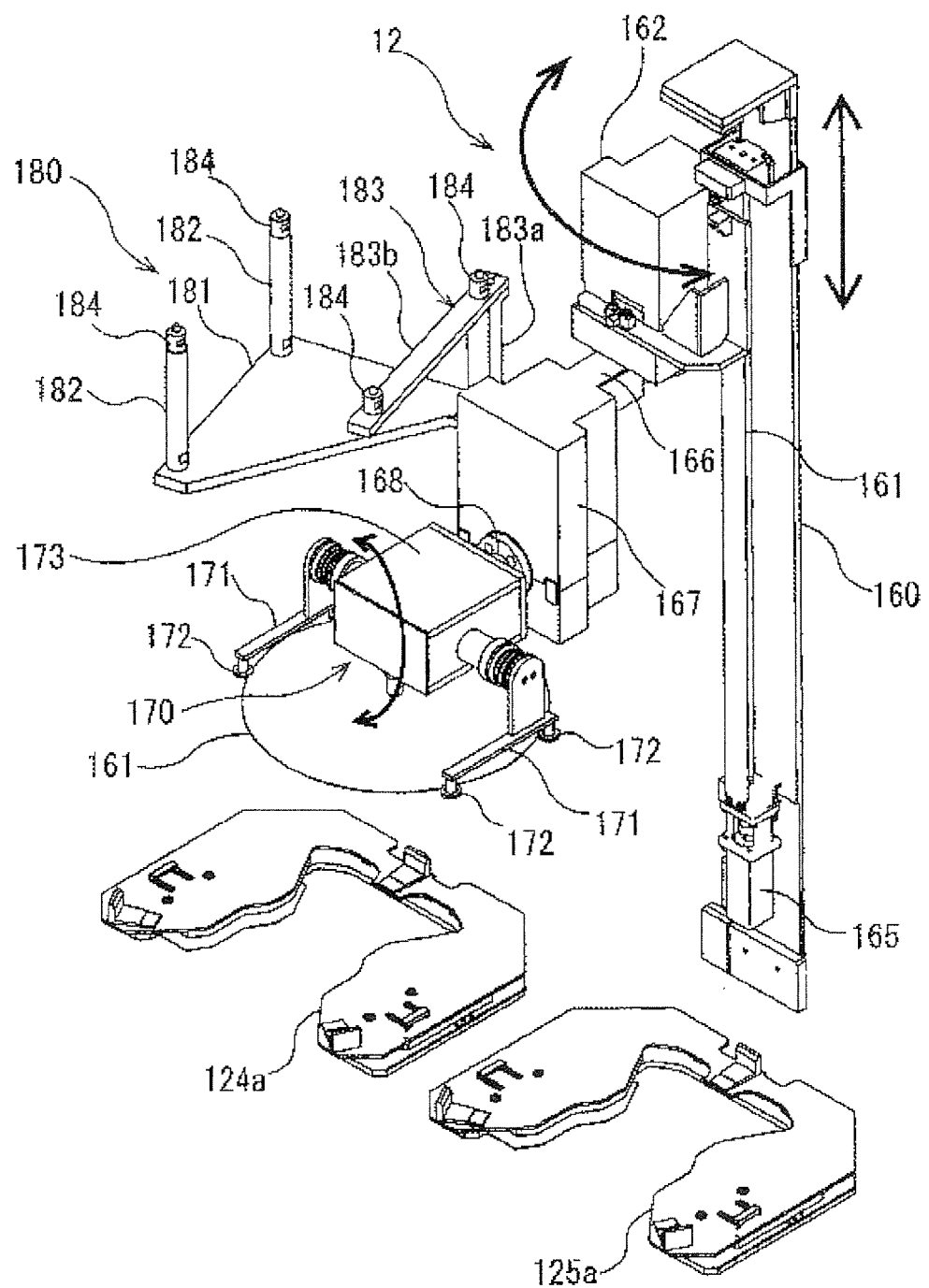
FIG. 4 is a perspective view showing the structure of a swing transporter.

FIG. 4 is a perspective view showing the structure of the swing transporter 12. The swing transporter 12 is installed at a frame 160 of the substrate processing apparatus. The swing transporter 12 includes a linear guide 161 which extends in the vertical direction, a swing mechanism 162 which is attached to the linear guide 161, and a lift drive mechanism 165 as a driving source which moves the swing mechanism 162 in the vertical direction. A robo-cylinder having a servomotor and a ball screw, or the like can be adopted as the lift drive mechanism 165. An inverting mechanism 167 is coupled to the swing mechanism 162 via a swing arm 166. A grasping mechanism 170 for grasping a wafer W is coupled to the inverting mechanism 167. A temporary table 180 for a wafer W which is installed at a frame (not shown) is arranged lateral to the swing transporter 12. As shown in FIG. 1, the temporary table 180 is arranged adjacent to the first linear transporter 6 and is located between the first linear transporter 6 and the cleaning unit 4.

The swing arm 166 turns about a rotating shaft of a motor (not shown) of the swing mechanism 162 by being driven by the motor. This turn sets the inverting mechanism 167 and the grasping mechanism 170 into integral turning motion. The grasping mechanism 170 moves between the fourth transport position TP4, the fifth transport position TP5, and the temporary table 180.

The grasping mechanism 170 has one pair of grasping arms 171 for grasping a wafer W. A chuck 172 which grasps an outer edge of a wafer W is provided at each end of each grasping arm 171. The chucks 172 are provided to protrude downward from the two ends of the grasping arms 171. The grasping mechanism 170 also includes an opening and closing mechanism 173 for moving the one pair of grasping arms 171 in directions toward and away from a wafer W.

To grasp a wafer W, the grasping mechanism 170 is lowered with the grasping arms 171 open until the chucks 172 of the grasping arms 171 are located in the same plane as the wafer W. The opening and closing mechanism 173 is driven to move each grasping arm 171 in a direction toward the other grasping arm 171. The outer edge of the wafer W is grasped by the chucks 172 of the grasping arms 171. In this state, the grasping arms 171 are moved up by the lift drive mechanism 165.

The inverting mechanism 167 has a rotating shaft 168 which is coupled to the grasping mechanism 170 and a motor (not shown) which rotates the rotating shaft 168. Driving of the rotating shaft 168 by the motor causes the grasping mechanism 170 to rotate by 180° in its entirety. With this rotation, a wafer W grasped by the grasping mechanism 170 is inverted. Since the entire grasping mechanism 170 is inverted by the inverting mechanism 167, as described above, transfer of a wafer between a grasping mechanism and an inverting mechanism that is previously required can be omitted. Note that, to transport a wafer W from the fourth transport position TP4 to the fifth transport position TP5, the inverting mechanism 167 does not invert the wafer W, and the wafer W is transported with a surface to be polished facing down. To transport a wafer W from the fourth transport position TP4 or the fifth transport position TP5 to the temporary table 180, the wafer W is inverted by the inverting mechanism 167 such that a polished surface faces upward.

The temporary table 180 has a base plate 181, a plurality of (two in FIG. 4) vertical rods 182 which are fixed to an upper surface of the base plate 181, and one inverted-L-shaped horizontal rod 183 which is fixed to the upper surface of the base plate 181. The horizontal rod 183 has a vertical section 183a which is connected to the upper surface of the base plate 181 and a horizontal section 183b which extends horizontally from an upper end of the vertical section 183a toward the grasping mechanism 170. A plurality of (two in FIG. 4) pins 184 for supporting a wafer W are provided on an upper surface of the horizontal section 183b. Respective pins 184 for supporting a wafer W are provided at upper ends of the vertical rods 182. Distal ends of the pins 184 are located in the same horizontal plane. The horizontal rod 183 is arranged at a position closer to a center of turning and movement of a wafer W (i.e., the rotating shaft of the motor of the swing mechanism 162) than the vertical rods 182.

The grasping mechanism 170 that is inverted by the inverting mechanism 167 goes into a space between the horizontal section 183b of the horizontal rod 183 and the base plate 181 while grasping a wafer W. When all of the pins 184 are located below the wafer W, turning of the grasping mechanism 170 by the swing mechanism 162 is stopped. The grasping arms 171 are opened in this state, which causes the wafer W to be mounted on the temporary table 180. The wafer W mounted on the temporary table 180 is transported to the cleaning unit 4 by a transport robot of the cleaning unit 4 to be described next.

<Cleaning Unit>

Figure 5A:
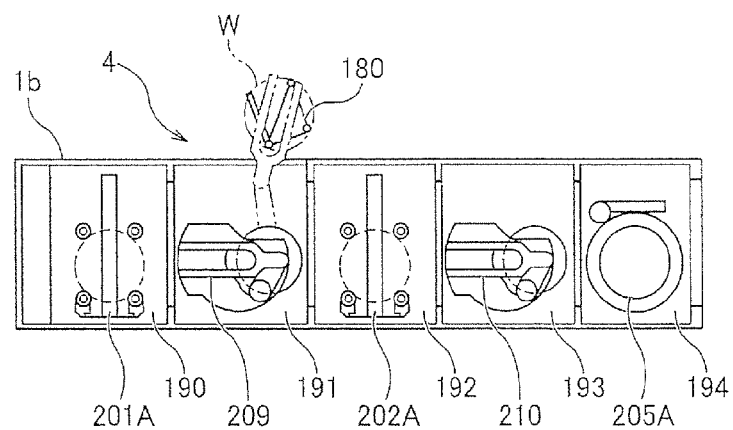
FIG. 5A is a side view showing a cleaning unit.
Figure 5B:
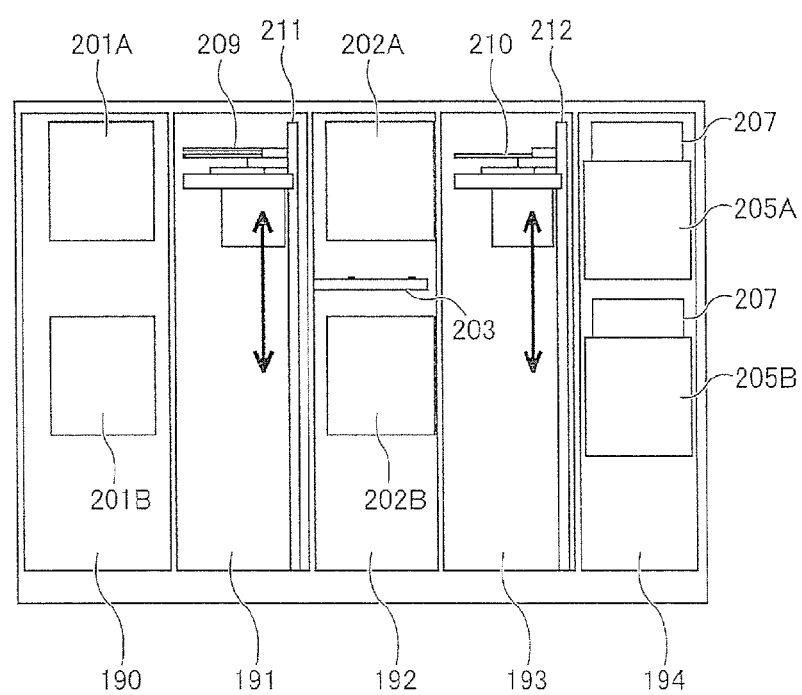
FIG. 5B is a side view showing the cleaning unit.

FIG. 5A is a plan view showing the cleaning unit 4, and FIG. 5B is a side view showing the cleaning unit 4. As shown in FIGS. 5A and 5B, the cleaning unit 4 is partitioned into a first cleaning chamber 190, a first transport chamber 191, a second cleaning chamber 192, a second transport chamber 193, and a drying chamber 194. An upper primary cleaning module 201A and a lower primary cleaning module 201B which are disposed along a lengthwise direction are arranged in the first cleaning chamber 190. The upper primary cleaning module 201A is arranged above the lower primary cleaning module 201B. Similarly, an upper secondary cleaning module 202A and a lower secondary cleaning module 202B which are disposed along the lengthwise direction are arranged in the second cleaning chamber 192. The upper secondary cleaning module 202A is arranged above the lower secondary cleaning module 202B. The primary and secondary cleaning modules 201A, 201B, 202A, and 202B are each a cleaning machine which cleans a wafer using a cleaning solution. The primary and secondary cleaning modules 201A and 201B, and 202A and 202B are disposed along the vertical direction, and thus have the advantages of small footprints.

A temporary table 203 for a wafer is provided between the upper secondary cleaning module 202A and the lower secondary cleaning module 202B. An upper drying module 205A and a lower drying module 205B which are disposed along the lengthwise direction are arranged in the drying chamber 194. The upper drying module 205A and the lower drying module 205B are separated from each other. Filter fan units 207 which supply clean air into the drying modules 205A and 205B are provided at upper portions of the upper drying module 205A and the lower drying module 205B. The upper primary cleaning module 201A, the lower primary cleaning module 201B, the upper secondary cleaning module 202A, the lower secondary cleaning module 202B, the temporary table 203, the upper drying module 205A, and the lower drying module 205B are fixed to a frame (not shown) via bolts or the like.

A first transport robot (transport mechanism) 209 which is vertically movable is arranged in the first transport chamber 191. A second transport robot 210 which is vertically movable is arranged in the second transport chamber 193. The first transport robot 209 and the second transport robot 210 are movably supported by supporting shafts 211 and 212, respectively, which extend in the lengthwise direction. The first transport robot 209 and the second transport robot 210 each incorporate a drive mechanism, such as a motor, and are vertically movable along the supporting shafts 211 and 212. The first transport robot 209 has two upper and lower hands, like the transport robot 22. The first transport robot 209 is arranged at a position where the lower hand can gain access to the temporary table 180 described above, as indicated by a dotted line in FIG. 5A. When the lower hand of the first transport robot 209 gains access to the temporary table 180, a shutter (not shown) which is provided at the partition 1b is opened.

The first transport robot 209 acts to transport a wafer W between the temporary table 180, the upper primary cleaning module 201A, the lower primary cleaning module 201B, the temporary table 203, the upper secondary cleaning module 202A, and the lower secondary cleaning module 202B. The first transport robot 209 uses the lower hand to transport a wafer to be cleaned (a wafer with slurry) and uses the upper hand to transport a cleaned wafer. The second transport robot 210 acts to transport a wafer W between the upper secondary cleaning module 202A, the lower secondary cleaning module 202B, the temporary table 203, the upper drying module 205A, and the lower drying module 205B. The second transport robot 210 transports only a cleaned wafer and thus includes one hand. The transport robot 22 shown in FIG. 1 takes out a wafer from the upper drying module 205A or the lower drying module 205B using the upper hand and returns the wafer to a wafer cassette. When the upper hand of the transport robot 22 gains access to the drying module 205A or 205B, a shutter (not shown) provided at the partition 1a is opened.

<Wafer W Transfer Test>

A wafer W transfer test in each unit will be described. In the present embodiment, a wafer W transfer test is performed independently in each of the cleaning unit 4 and the loading/unloading unit 2, and no wafer W transfer test is performed in the polishing unit 3. As described above, in the polishing unit 3, a wafer W is passed from the transport robot 22 of the loading/unloading unit 2 to the lifter 11. The polishing unit 3 is deprived of a wafer W put on the temporary table 180 by the transport robot 209 of the cleaning unit 4. As described above, the polishing unit 3 serves as a passive unit in wafer W transfer. Note that although there are various types of startup (tests) before full-scale operation in the substrate processing apparatus, only a wafer W transfer test between units will be described here.

<Wafer W Transfer Test in Cleaning Unit>

Figure 6:
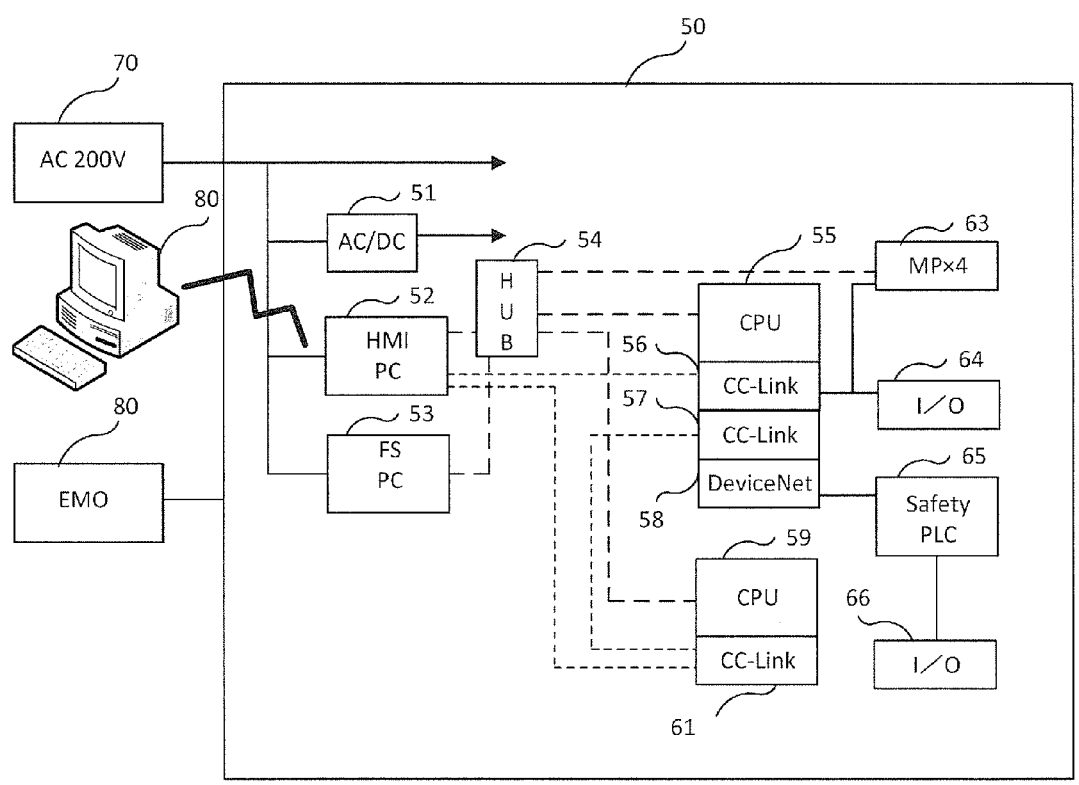
FIG. 6 is a diagram showing the configuration of a unit control panel included in a control section of a cleaning unit.

A wafer W transfer test for the cleaning unit 4 will be described first. FIG. 6 is a diagram showing the configuration of a unit control panel which is included in the control section 5 of the cleaning unit 4.

As shown in FIG. 6, a unit control panel 50 includes an AC/DC converter 51, an HMI (Human Machine Interface) PC (Personal Computer) 52, a FS (File Server) PC 53, and a hub 54. The unit control panel 50 also includes CPUs 55 and 59, CC-Link® modules 56, 57, and 61, a DeviceNet® module 58, four MPs 63, I/Os 64 and 66, a safety PLC (Programmable Logic Controller) 65, and an EMO (EMergency Off) switch 80.

The AC/DC converter 51 converts 200 V AC supplied from an external AC power supply 70 to 24 V DC. The 200 V AC fed from the AC power supply 70 is supplied to a driver for a transport robot or the like, the CPUs 55 and 59, and the like in the cleaning unit 4. The 24 V DC output from the AC/DC converter 51 is supplied to the I/Os 64 and 66 and the like.

The HMI PC 52 serves as an interface with a PC 80 for entering a command related to a wafer W transfer test or the like. The HMI PC 52 receives a command signal output from the PC 80 and outputs the command signal to the FS PC 53, the CPUs 55 and 59, and the like.

The FS PC 53 manages various types of logs related to the cleaning unit 4. The HMI PC 52, the FS PC 53, the CPUs 55 and 59, and the MPs 63 are connected to one another via the hub 54 (a concentrator) by Ethernet®. The HMI PC 52 and the CPUs 55 and 59 are connected to one another via the CC-Link modules 56, 57, and 61 by CC-Link IE®. The EMO switch 80 is a button for bringing the substrate processing apparatus to an emergency stop.

The CPU 55 is a unit for performing various types of control for wafer W transport processing, wafer W cleaning processing, wafer W drying processing, and the like in the cleaning unit 4. The CPU (test control section) 59 performs control related to a wafer W transfer test for the cleaning unit 4 in cooperation with the HMI PC 52. The CPU 59 performs a substrate transfer test for the cleaning unit 4 using a substrate table installed outside the cleaning unit 4, for example, while the cleaning unit 4 provided with the unit control panel 50 is not assembled together with the polishing unit 3 (another unit). Note that although the description below illustrates an example in which the CPU 59 performs control related to a wafer W transfer test for the cleaning unit 4, the CPU 55 may perform control related to a wafer W transfer test.

The CPU 55 is connected to the four MPs 63 that are motion controllers and the I/O 64 that is an input/output interface. The CPU 55 is also connected to the I/O 66 via the safety PLC 65 that stops action of the cleaning unit 4, for example, if a problem, such as water leakage, occurs.

Figure 7:
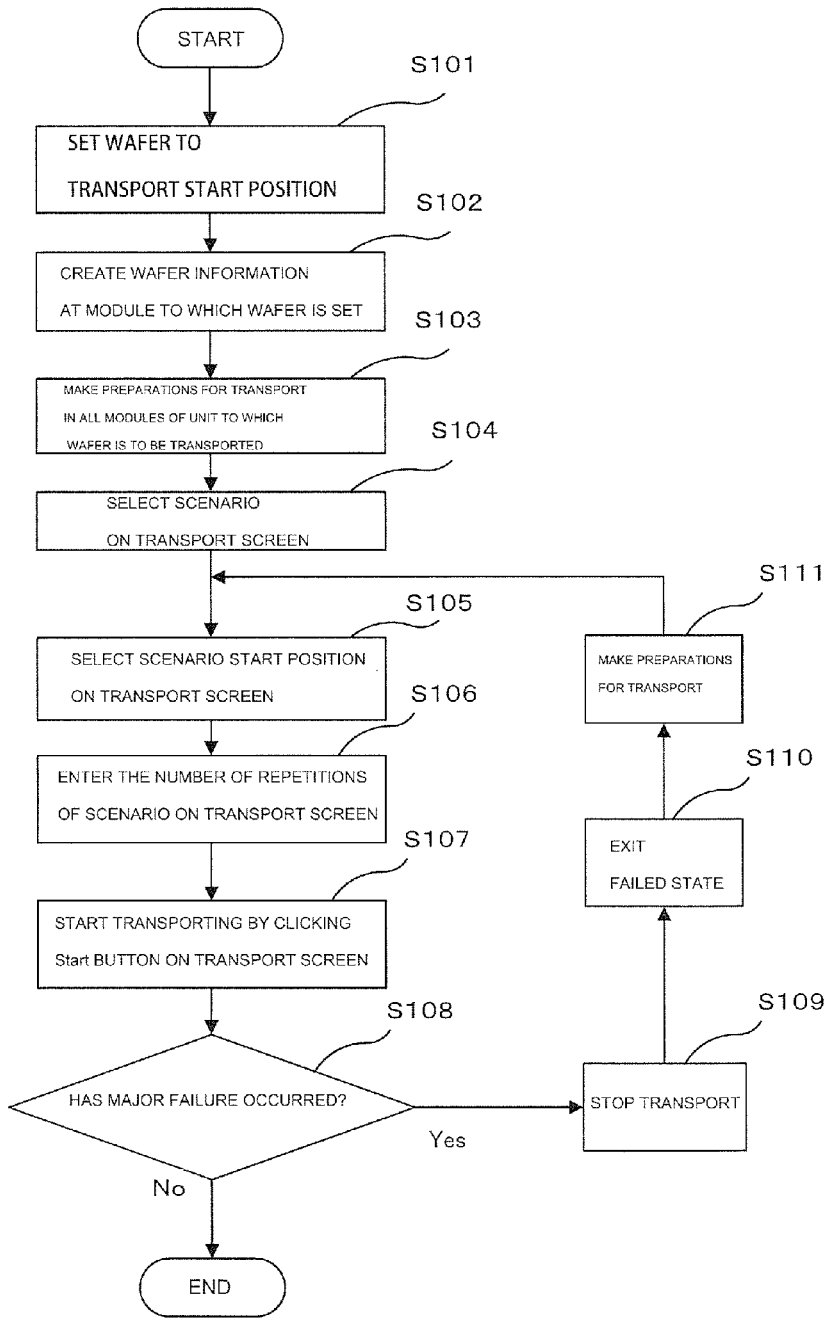
FIG. 7 is a chart showing an operation flow related to a wafer transfer test for the cleaning unit.
Figure 8:
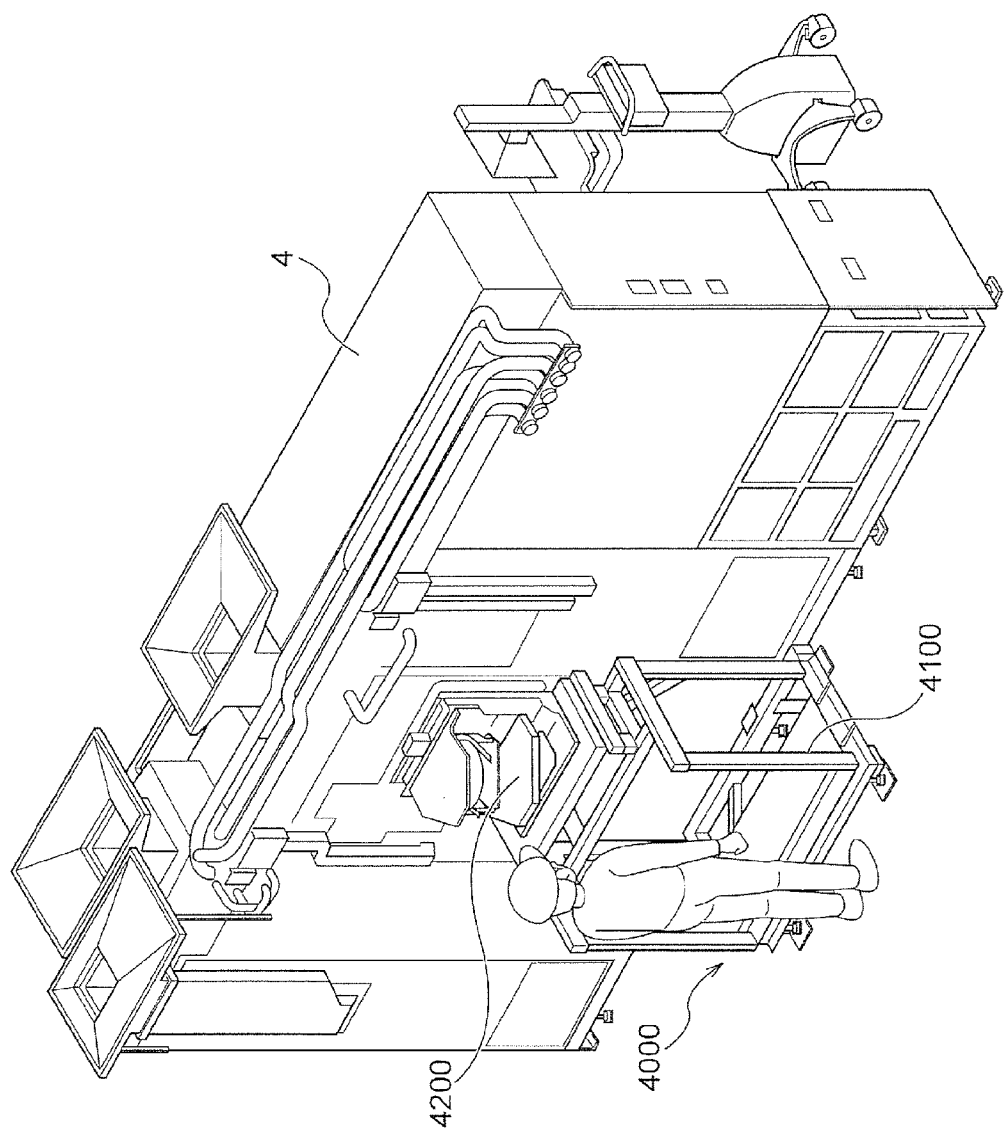
FIG. 8 is a view schematically showing how a substrate table for a wafer transfer test is installed to the cleaning unit.
Figure 9:
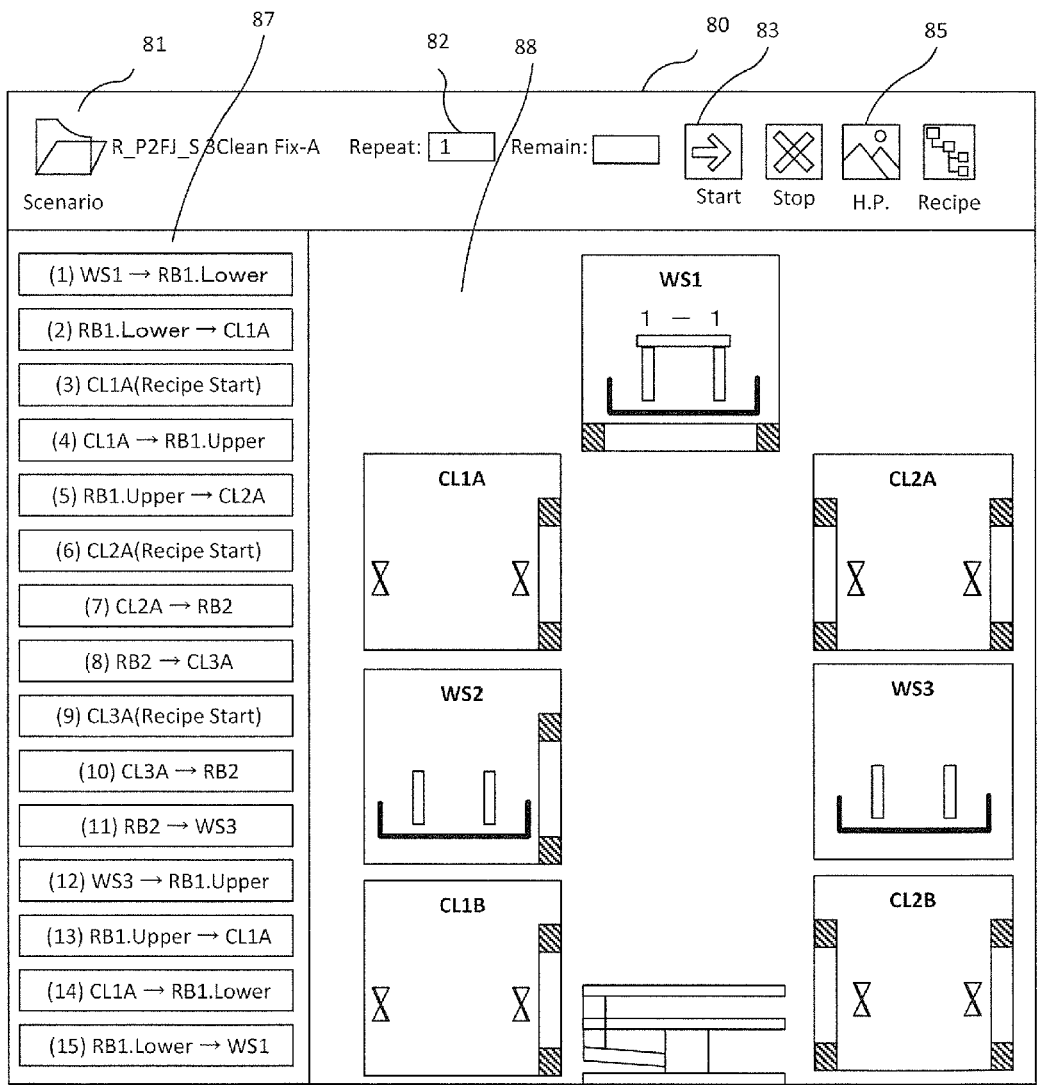
FIG. 9 is a view schematically showing an input/output interface at the time of a wafer transfer test for the cleaning unit.

An operation flow related to a wafer W transfer test for the cleaning unit 4 will be described. FIG. 7 is a chart showing the operation flow related to a wafer transfer test for the cleaning unit 4. FIG. 8 is a view schematically showing how a substrate table for a wafer transfer test is installed to the cleaning unit 4. FIG. 9 is a view schematically showing an input/output interface at the time of a wafer transfer test for the cleaning unit 4.

As shown in FIG. 7, in a wafer W transfer test, a wafer W is first set to a transport start position (step S101). If the cleaning unit 4 and the polishing unit 3 have been assembled together, the transport start position for the wafer W in the cleaning unit 4 is the temporary table 180. Since the temporary table 180 is a module incorporated in the polishing unit 3, the temporary table 180 is absent when a wafer W transfer test is performed in the cleaning unit 4 alone. For this reason, in the present embodiment, a transfer test jig 4000 is installed instead of the temporary table 180 at the time of a wafer W transfer test for the cleaning unit 4 alone. The transfer test jig 4000 includes a frame 4100 and a substrate table 4200.

As shown in FIG. 8, the substrate table 4200 is installed on the frame 4100. The substrate table 4200 is installed for a wafer W transfer test at a location where the temporary table 180 (a substrate transfer section) of the polishing unit 3 is located when the cleaning unit 4 and the polishing unit 3 (the other unit) are assembled together. The temporary table 180 is used at the time of transfer of a wafer W between the cleaning unit 4 and the polishing unit 3. The frame 4100 is adjusted such that the substrate table 4200 is installed at an appropriate position.

In the wafer W transfer test, wafer W information is created at a module to which the wafer W is set (step S102). In the wafer W transfer test, all modules of a unit to which the wafer W is to be transported (the cleaning unit 4) make preparations for transport (step S103). More specifically, a user gives various types of instructions as to the wafer W transfer test and monitors motion of the wafer W on a screen for a wafer W transfer test of the PC 80 shown in FIG. 9. The user gives an instruction for the preparations for transport in the cleaning unit 4 by clicking a H.P. button 85. Note that an instruction signal input from the screen for a wafer W transfer test of the PC 80 is output to blocks of the unit control panel 50 via the HMI PC 52.

In the wafer W transfer test, a scenario is selected on a transport screen (step S104). More specifically, a scenario is selected by clicking a scenario button 81 on the screen for a wafer W transfer test of the PC 80 shown in FIG. 9.

In the wafer W transfer test, a scenario start position is selected on the transport screen (step S105). For example, if a given scenario is selected, a transport route 87 for the wafer W is presented as blocks (1) to (15), as in the example in FIG. 9. Blocks (1) to (15) indicate by which route the wafer W is transported. In step S105, from which point transport of the wafer W is to be started is selected by selecting any one of blocks (1) to (15).

In the wafer W transfer test, the number of repetitions of the scenario is entered on the transport screen (step S106). More specifically, the number of repetitions of the scenario is entered in a number-of-repetitions entry field 82 on the screen for a wafer W transfer test of the PC 80 shown in FIG. 9.

In the wafer W transfer test, a Start button on the transport screen is clicked, and transport is started (step S107). More specifically, the transport of the wafer W is started when a Start button 83 is clicked on the screen for a wafer W transfer test of the PC 80 shown in FIG. 9. When the transport of the wafer W is started, an image representing the wafer W moves in a monitor region 88 in FIG. 9 in response to actual motion of the wafer W.

In the wafer W transfer test, it is determined whether a major failure has occurred in a unit executing the wafer W transfer test (the cleaning unit 4 here) (step S108). If it is determined that no major failure has occurred in the unit executing the wafer W transfer test (No in step S108), transport of the wafer W is performed as normal, and the process ends.

In the wafer W transfer test, if it is determined that a major failure has occurred in the unit executing the wafer W transfer test (Yes in step S108), transport of the wafer W is stopped (step S109). When the major failure of the unit is handled, and the unit recovers from the major failure, the unit exits the failed state (step S110). In the wafer W transfer test, preparations for transport of the wafer W are made (step S111). The flow returns to step S105 to repeat processing.

Figure 10:
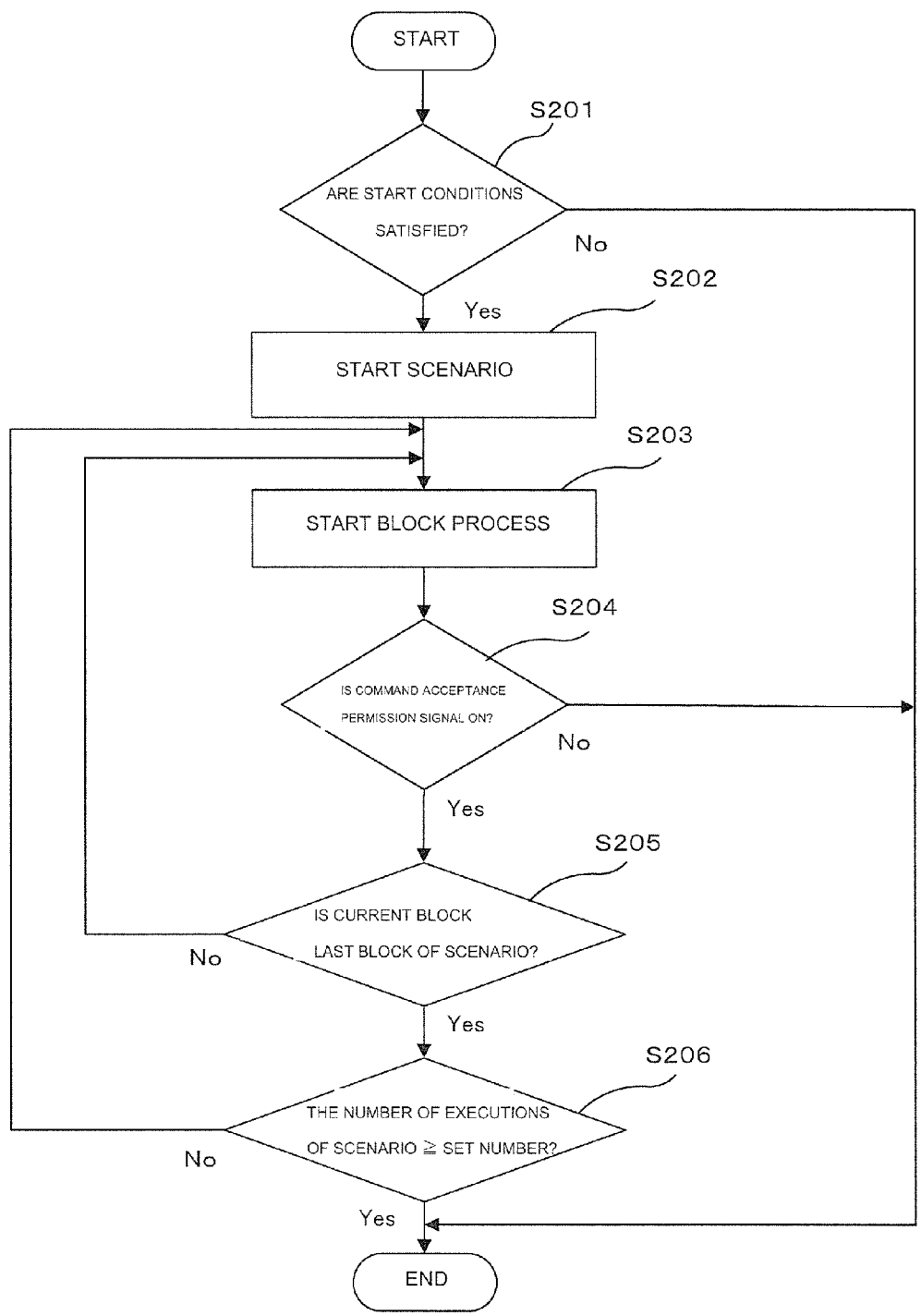
FIG. 10 is a chart showing a scenario execution flow in a wafer transfer test.

A scenario execution flow in a wafer W transfer test will be described. FIG. 10 is a chart showing the scenario execution flow in the wafer W transfer test.

In the scenario execution flow, the CPU 59 first determines whether start conditions are satisfied (step S201). More specifically, the CPU 59 determines whether a wafer W is placed at a start position, whether information on the wafer W is input in step S102, whether there is any failure in the cleaning unit 4, and the like and, if the conditions are satisfied, determines that the start conditions are satisfied. If the CPU 59 determines that the start conditions are not satisfied (No in step S201), the CPU 59 ends the process.

On the other hand, if the CPU 59 determines that the start conditions are satisfied (Yes in step S201), a scenario is started (step S202). More specifically, the scenario starts when the flow in FIG. 7 is executed.

The CPU 59 starts a block process (step S203). More specifically, various types of instruction signals (commands) transmitted from the PC 80 to the HMI PC 52 are sent to the CPU 59, and a wafer W transport test is performed by the CPU 59. The CPU 59 performs the wafer W transfer test by receiving the wafer W mounted on the substrate table 4200 and transporting the wafer W into the cleaning unit 4 by the transport robot 209.

The CPU 59 then determines whether a command acceptance permission signal is ON (step S204). If the CPU 59 determines that the command acceptance permission signal is not ON (No in step S204), command acceptance is impossible, and the CPU 59 ends the process.

On the other hand, if the CPU 59 determines that the command acceptance permission signal is ON (Yes in step S204), the CPU 59 determines whether a current block is a last block of the scenario (step S205). If the CPU 59 determines that the current block is not the last block of the scenario (No in step S205), the flow returns to step S203 to repeat processing.

If the CPU 59 determines whether the current block is the last block of the scenario (Yes in step S205), the CPU 59 determines whether the number of executions of the scenario is not less than a set number (step S206). This is a step of determining whether the number of times the scenario has been actually executed has reached the number of repetitions of the scenario entered in step S106.

If the CPU 59 determines that the number of executions of the scenario is less than the set number (No in step S206), the flow returns to step S203 to repeat processing from a first block. On the other hand, if the CPU 59 determines that the number of executions of the scenario is not less than the set number (Yes in step S206), the CPU 59 ends the process.

As described above, according to the present embodiment, the wafer transfer test jig 4000 (the substrate table 4200) is installed instead of the temporary table 180 at the time of a wafer W transfer test for the cleaning unit 4. Thus, according to the present embodiment, a wafer W transfer test can be performed even in the cleaning unit 4 alone. When a wafer W transfer test is performed in the cleaning unit 4 alone, even if a problem occurs in the transfer test, the problem can be quickly handled. After success in a wafer W transfer test for the cleaning unit 4 alone, the cleaning unit 4, the polishing unit 3, and/or the loading/unloading unit 2 are assembled together. This allows quick success in a substrate transfer test between the plurality of units and enhancement of work efficiency.

<Wafer W Transfer Test in Loading/Unloading Unit>

Figure 11:
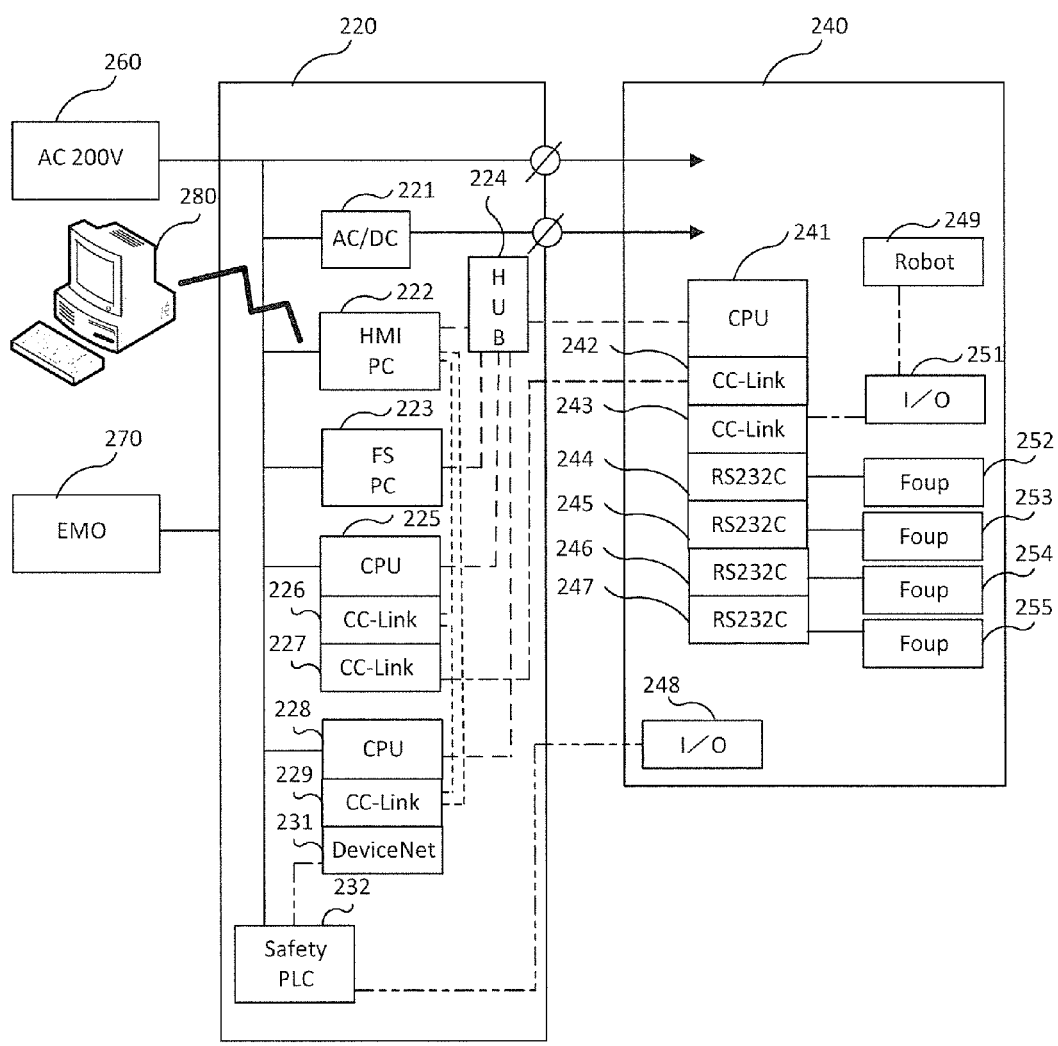
FIG. 11 is a diagram showing the configuration of a unit control panel included in a loading/unloading unit.

A wafer W transfer test for the loading/unloading unit 2 will be described. FIG. 11 is a diagram showing the configuration of a unit control panel which is included in the loading/unloading unit 2.

As shown in FIG. 11, the loading/unloading unit 2 includes a unit control panel 220 which is provided for a wafer W transfer test and an EFEM (Equipment Front End Module) panel 240 which is inherently provided for various types of processes, such as transport of a wafer W, in the loading/unloading unit 2.

The unit control panel 220 includes an AC/DC converter 221, an HMI PC 222, a FS PC 223, and a hub 224. The unit control panel 220 also includes a CPU 225, CC-Link modules 226 and 227, a CPU 228, a CC-Link module 229, a DeviceNet module 231, a safety PLC 232, and an EMO switch 270.

The EFEM panel 240 includes a CPU 241, CC-Link modules 242 and 243, RS232C modules 244 to 247, I/Os 248 and 251, a robot (transport robot) 249, and FOUPs 252 to 255.

The AC/DC converter 221 converts 200 V AC supplied from an external AC power supply 250 to 24 V DC. The 200 V AC fed from the AC power supply 250 is supplied to the robot 249, the FOUPs 252 to 255, the CPUs 225, 228, and 241, the safety PLC 232, and the like in the loading/unloading unit 2. The 24 V DC output from the AC/DC converter 221 is supplied to the I/Os 248 and 251 and the like.

The HMI PC 222 serves as an interface with a PC 280 for entering a command related to a wafer W transfer test or the like. The HMI PC 222 receives a command signal output from the PC 280 and outputs the command signal to the FS PC 223, the CPUs 225, 228, and 241, and the like.

The FS PC 223 manages various types of logs related to the loading/unloading unit 2. The HMI PC 222, the FS PC 223, and the CPUs 225, 228, and 241 are connected to one another via the hub 224 (a concentrator) by Ethernet®. The HMI PC 222 and the CPU 225 and 228 are connected to one another via the CC-Link modules 226 and 229 by CC-Link IE®. The CPU 225 and the CPU 241, the CPU 241 and the I/O 251, and the I/O 251 and the robot 249 are connected via the CC-Link modules 227, 242, and 243 by CC-Link®. The EMO switch 270 is a button for bringing the substrate processing apparatus to an emergency stop.

The CPU 241 is a unit for performing various types of control for wafer W transport processing and the like in the loading/unloading unit 2. The CPU (test control section) 225 performs control related to a wafer W transfer test for the loading/unloading unit 2 in cooperation with the HMI PC 222. The CPU 225 performs a substrate transfer test for the loading/unloading unit 2 using a substrate table installed outside the loading/unloading unit 2, for example, while the loading/unloading unit 2 provided with the unit control panel 220 is not assembled together with the polishing unit 3 and the cleaning unit 4 (other units).

The CPU 228 serves as an interface between the safety PLC 232 and the CPU 225. The CPU 228 is connected by DeviceNet® to the I/O 248 via the safety PLC 232 that stops action of the loading/unloading unit 2, for example, if a problem, such as water leakage, occurs. The CPU 241 is connected to the FOUPs 252 to 255 via the RS232C modules 244 to 247.

An operation flow related to a wafer W transfer test for the loading/unloading unit 2 is basically the same as that in the case of the cleaning unit 4 shown in FIG. 7, and a detailed description thereof will be omitted. An input/output interface at the time of a wafer W transfer test for the loading/unloading unit 2 is the same as that in the case of the cleaning unit 4 shown in FIG. 9 except that the transport route 87 for a wafer W and the monitor region 88 are replaced with ones corresponding to the loading/unloading unit 2, and a description thereof will be omitted. A scenario execution flow in a wafer W transfer test for the loading/unloading unit 2 is the same as that in the case of the cleaning unit 4 shown in FIG. 10, and a detailed description thereof will be omitted.

Figure 12:
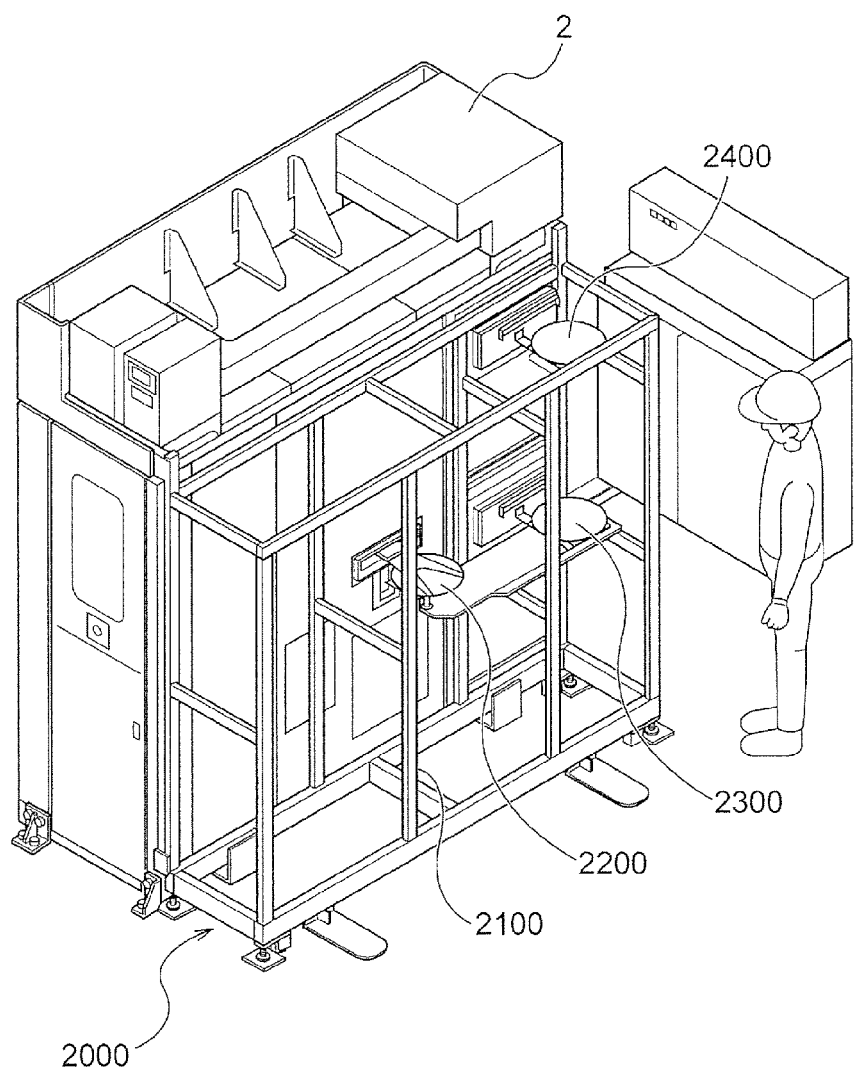
FIG. 12 is a view schematically showing how a substrate table for a wafer transfer test is installed to the loading/unloading unit.

Differences from a wafer W transfer test for the cleaning unit 4 will be described below. FIG. 12 is a view schematically showing how a substrate table for a wafer W transfer test is installed to the loading/unloading unit 2.

If the loading/unloading unit 2, the cleaning unit 4, and the polishing unit 3 have been assembled together, transport start positions for a wafer W in the loading/unloading unit 2 are the upper drying module 205A and the lower drying module 205B. A transport destination for the wafer W is the lifter 11. Since the upper drying module 205A and the lower drying module 205B are modules incorporated in the cleaning unit 4, and the lifter 11 is a module incorporated in the polishing unit 3, the upper drying module 205A, the lower drying module 205B, and the lifter 11 are absent when a wafer W transfer test is performed in the loading/unloading unit 2 alone. For this reason, in the present embodiment, a transfer test jig 2000 is installed instead of the upper drying module 205A, the lower drying module 205B, and the lifter 11 to perform a wafer W transfer test for the loading/unloading unit 2 alone. The transfer test jig 2000 includes a frame 2100 and substrate tables 2200, 2300, and 2400.

As shown in FIG. 12, the substrate tables 2200, 2300, and 2400 are installed while being supported by the frame 2100. The substrate tables 2300 and 2400 are installed for a wafer W transfer test at locations where the upper drying module 205A and the lower drying module 205B (substrate transfer sections) of the cleaning unit 4 are located. The upper drying module 205A and the lower drying module 205B are used at the time of transfer of a wafer W between the loading/unloading unit 2 and the cleaning unit 4 when the loading/unloading unit 2 and the cleaning unit 4 (a different unit) are assembled together. The substrate table 2200 is installed for a wafer W transfer test at a location where the lifter 11 (a substrate transfer section) of the polishing unit 3 is located. The lifter 11 is used at the time of transfer of a wafer W between the loading/unloading unit 2 and the polishing unit 3 (a different unit) when the loading/unloading unit 2 and the polishing unit 3 are assembled together. The frame 2100 is adjusted such that the substrate tables 2200, 2300, and 2400 are installed at appropriate positions.

The CPU 225 transports a wafer W placed in the loading/unloading unit 2 to the substrate table 2200 and mounts the wafer W on the substrate table 2200 by a wafer W transport mechanism (a transfer robot) which is provided in the loading/unloading unit 2. The CPU 225 also receives a wafer W mounted on the substrate table 2300 or 2400 and transports the wafer W into the loading/unloading unit 2 by a transport mechanism (transport robot). In the above-described manner, the CPU 225 performs a wafer W transfer test.

As has been described above, according to the present embodiment, the transfer test jig 2000 (the substrate tables 2200, 2300, and 2400) is installed instead of the upper drying module 205A, the lower drying module 205B, and the lifter 11 at the time of a wafer W transfer test for the loading/unloading unit 2. With this installation, a wafer W transfer test can be performed even in the loading/unloading unit 2 alone. When a wafer W transfer test is performed in the loading/unloading unit 2 alone, even if a problem occurs in a transfer test, the problem can be quickly handled. After success in a wafer W transfer test for the loading/unloading unit 2 alone, the cleaning unit 4, the polishing unit 3, and the loading/unloading unit 2 are assembled together. This allows quick success in a substrate transfer test between the plurality of units and enhancement of work efficiency.

REFERENCE SIGNS LIST 2 loading/unloading unit
3 polishing unit 4 cleaning unit
5 control section
11 lifter
22 transport robot
50 unit control panel
59, 225 CPU (test control section)
180 temporary table
205A upper drying module
205B lower drying module
220 unit control panel
2000, 4000 test jig
2100, 4100 frame
2200, 2300, 2400, 4200 substrate table
W wafer

What is claimed is:

1. A unit control panel provided in at least one of units of a substrate processing apparatus, the substrate processing apparatus processing a substrate with transferring the substrate between the units assembled together, comprising
a test control section configured to perform a substrate transfer test for a unit provided with the unit control panel using a substrate table which is installed outside the unit while the unit is not assembled together with another unit, the test control section configured to determine whether a major failure occurs in the unit executing the substrate transfer test,
wherein the substrate transfer test is performed by:
selecting a scenario for which a transport route for the substrate is presented as a plurality of blocks;
selecting a scenario start position from which transport of the substrate is to be started by selecting any one of the blocks;
receiving the number of repetitions of the selected scenario; and
transferring the substrate based on the selected scenario and the received number of repetitions of the selected scenario.

2. The unit control panel according to claim 1, wherein the test control section performs the substrate transfer test by transporting the substrate placed in the unit to the substrate table and mounting the substrate on the substrate table by a substrate transport mechanism which is provided in the unit or receiving the substrate mounted on the substrate table and transporting the substrate into the unit by the transport mechanism.

3. The unit control panel according to claim 1, wherein the substrate table is installed for the substrate transfer test at a location where a substrate transfer section of another unit which is used at a time of transfer of the substrate between the unit and another unit is located when the unit and another unit are assembled together.

4. The unit control panel according to claim 1, wherein the test control section determines whether a current block is the last block of the selected scenario, and
if the test control unit determines the current block is not the last block, the scenario moves to a next block of the selected scenario.

5. The unit control panel according to claim 4, wherein if the test control unit determines the current block is the last block, the test control section determines whether the number of execution of the scenario in not less than the entered number of repetitions of the scenario.

6. The unit control panel according to claim 5, wherein if the test control section determines that the number of execution of the scenario is less than the entered number of repetitions of the scenario, the scenario starts again from the selected scenario start position.

7. The unit control panel according to claim 5, wherein if the test control section determines that the number of execution of the scenario is less than the entered number of repetitions of the scenario, the test control section ends the substrate transfer test.

8. The unit control panel according to claim 1, wherein if the test control section determines a major failure occurs in the unit, transport of the substrate is stopped, and
if the test control section determines no major failure occurs in the unit, transport of the substrate is continued.

9. A unit control panel provided in at least one of units of a substrate processing apparatus, the substrate processing apparatus processing a substrate with transferring the substrate between the units assembled together, comprising
a test control section configured to perform a substrate transfer test for a unit provided with the unit control panel using a substrate table which is installed outside the unit while the unit is not assembled together with another unit, the test control section configured to determine whether a major failure occurs in the unit executing the substrate transfer test,
wherein the substrate processing apparatus includes a polishing unit configured to polish the substrate and mount the polished substrate on a temporary table, and a cleaning unit configured to clean and dry the substrate mounted on the temporary table, and the unit control panel is provided in the cleaning unit,
the substrate table is installed for the substrate transfer test instead of the temporary table at a location where the temporary table is located when the polishing unit and the cleaning unit are assembled together, and
the test control section of the unit control panel provided in the cleaning unit performs the substrate transfer test by receiving the substrate mounted on the substrate table and transporting the substrate into the cleaning unit by a substrate transport mechanism which is provided in the cleaning unit.

10. A unit control panel provided in at least one of units of a substrate processing apparatus, the substrate processing apparatus processing a substrate with transferring the substrate between the units assembled together, comprising
a test control section configured to perform a substrate transfer test for a unit provided with the unit control panel using a substrate table which is installed outside the unit while the unit is not assembled together with another unit, the test control section configured to determine whether a major failure occurs in the unit executing the substrate transfer test,
wherein the substrate processing apparatus includes a polishing unit configured to polish the substrate, a cleaning unit configured to clean and dry the substrate polished by the polishing unit, and a loading/unloading unit configured to load the substrate onto a lifter in the polishing unit and unload the substrate mounted on a substrate drying module in the cleaning unit, and the unit control panel is provided in the loading/unloading unit,
the substrate table is installed for the substrate transfer test instead of the lifter at a location where the lifter is located when the polishing unit and the loading/unloading unit are assembled together and is installed for the substrate transfer test instead of the drying module at a location where the drying module is located when the cleaning unit and the loading/unloading unit are assembled together, and the test control section of the unit control panel provided in the loading/unloading unit performs the substrate transfer test by transporting the substrate placed in the loading/unloading unit to the substrate table and mounting the substrate on the substrate table by a substrate transport mechanism which is provided in the loading/unloading unit and receiving the substrate mounted on the substrate table and transporting the substrate into the loading/unloading unit by the transport mechanism.

11. A substrate transfer test method in at least one of units of a substrate processing apparatus, the substrate processing apparatus processing a substrate with transferring the substrate between the units assembled together, comprising:
  installing a substrate table outside the at least one unit while the at least one unit is not assembled together with another unit;
  performing a substrate transfer test for the at least one unit using the substrate table; and
  determining whether a major failure occurs in the unit executing the substrate transfer test,
  wherein the substrate transfer test is performed by:
  selecting a scenario for which a transport route for the substrate is presented as a plurality of blocks;
  selecting a scenario start position from which transport of the substrate is to be started by selecting any one of the blocks;
  receiving the number of repetitions of the selected scenario; and
  transferring the substrate based on the selected scenario and the received number of repetitions of the selected scenario.

12. The substrate transfer test method according to claim 11, wherein
  the substrate transfer test is performed by transporting the substrate placed in the at least one unit to the substrate table and mounting the substrate on the substrate table by a substrate transport mechanism which is provided in the at least one unit or receiving the substrate mounted on the substrate table and transporting the substrate into the at least one unit by the transport mechanism.

13. The substrate transfer test method according to claim 11, wherein
  the substrate table is installed for the substrate transfer test at a location where a substrate transfer section of another unit which is used at a time of transfer of the substrate between the unit and another unit is located when the unit and another unit are assembled together.

14. A substrate transfer test method in at least one of units of a substrate processing apparatus, the substrate processing apparatus processing a substrate with transferring the substrate between the units assembled together, comprising:
  installing a substrate table outside the at least one unit while the at least one unit is not assembled together with another unit;
  performing a substrate transfer test for the at least one unit using the substrate table; and
  determining whether a major failure occurs in the unit executing the substrate transfer test,
  wherein the substrate processing apparatus includes a polishing unit configured to polish the substrate and mount the polished substrate on a temporary table and a cleaning unit configured to clean and dry the substrate mounted on the temporary table, and the substrate transfer test is performed in the cleaning unit,
  the substrate table is installed for the substrate transfer test instead of the temporary table at a location where the temporary table is located when the polishing unit and the cleaning unit are assembled together, and
  the substrate transfer test is performed by receiving the substrate mounted on the substrate table and transporting the substrate into the cleaning unit by a substrate transport mechanism which is provided in the cleaning unit.

15. A substrate transfer test method in at least one of units of a substrate processing apparatus, the substrate processing apparatus processing a substrate with transferring the substrate between the units assembled together, comprising:
  installing a substrate table outside the at least one unit while the at least one unit is not assembled together with another unit;
  performing a substrate transfer test for the at least one unit using the substrate table; and
  determining whether a major failure occurs in the unit executing the substrate transfer test,
  wherein the substrate processing apparatus includes a polishing unit configured to polish the substrate, a cleaning unit configured to clean and dry the substrate polished by the polishing unit, and a loading/unloading unit configured to load the substrate onto a lifter in the polishing unit and unload the substrate mounted on a substrate drying module in the cleaning unit, and the substrate transfer test is performed in the loading/unloading unit,
  the substrate table is installed for the substrate transfer test instead of the lifter at a location where the lifter is located when the polishing unit and the loading/unloading unit are assembled together and is installed for the substrate transfer test instead of the drying module at a location where the drying module is located when the cleaning unit and the loading/unloading unit are assembled together, and
  the substrate transfer test is performed by transporting the substrate placed in the loading/unloading unit to the substrate table installed instead of the lifter and mounting the substrate on the substrate table by a substrate transport mechanism which is provided in the loading/unloading unit and receiving the substrate mounted on the substrate table installed instead of the drying module and transporting the substrate into the loading/unloading unit by the transport mechanism.

16. A substrate processing apparatus for processing a substrate, comprising:
  at least one unit which is each provided with a unit control panel, the unit including a test control section configured to perform a substrate transfer test for the unit using a substrate table which is installed outside the unit while the unit is not assembled together with another unit, the test control section configured to determine whether a major failure occurs in the unit executing the substrate transfer test; and
  another unit which is to be assembled together with the unit,
  wherein the substrate processing apparatus processes a substrate and transfers the substrate between the unit and another unit assembled together,
  wherein the substrate transfer test is performed by:
  selecting a scenario for which a transport route for the substrate is presented as a plurality of blocks;
  selecting a scenario start position from which transport of the substrate is to be started by selecting any one of the blocks;

receiving the number of repetitions of the selected scenario; and transferring the substrate based on the selected scenario and the received number of repetitions of the selected scenario.

17. The substrate processing apparatus according to claim 16, wherein the test control section performs the substrate transfer test by transporting the substrate placed in the unit to the substrate table and mounting the substrate on the substrate table by a substrate transport mechanism which is provided in the unit or receiving the substrate mounted on the substrate table and transporting the substrate into the unit by the transport mechanism.

18. The substrate processing apparatus according to claim 16, wherein the substrate table is installed for the substrate transfer test at a location where a substrate transfer section of another unit which is used at a time of transfer of the substrate between the unit and another unit is located when the unit and another unit are assembled together.

19. A substrate processing apparatus for processing a substrate, comprising:

at least one unit which is each provided with a unit control panel, the unit including a test control section configured to perform a substrate transfer test for the unit using a substrate table which is installed outside the unit while the unit is not assembled together with another unit, the test control section configured to determine whether a major failure occurs in the unit executing the substrate transfer test; and another unit which is to be assembled together with the unit, wherein the substrate processing apparatus processes a substrate and transfers the substrate between the unit and another unit assembled together, wherein the substrate processing apparatus comprises a polishing unit configured to polish the substrate and mount the polished substrate on a temporary table, and a cleaning unit configured to clean and dry the substrate mounted on the temporary table, and the unit control panel is provided in the cleaning unit, the substrate table is installed for the substrate transfer test instead of the temporary table at a location where the temporary table is located when the polishing unit and the cleaning unit are assembled together, and the test control section of the unit control panel provided in the cleaning unit performs the substrate transfer test by receiving the substrate mounted on the substrate table and transporting the substrate into the cleaning unit by a substrate transport mechanism which is provided in the cleaning unit.

20. A substrate processing apparatus for processing a substrate, comprising:

at least one unit which is each provided with a unit control panel, the unit including a test control section configured to perform a substrate transfer test for the unit using a substrate table which is installed outside the unit while the unit is not assembled together with another unit, the test control section configured to determine whether a major failure occurs in the unit executing the substrate transfer test; and another unit which is to be assembled together with the unit, wherein the substrate processing apparatus processes a substrate and transfers the substrate between the unit and another unit assembled together, wherein the substrate processing apparatus comprises a polishing unit configured to polish the substrate, a cleaning unit configured to clean and dry the substrate polished by the polishing unit, and a loading/unloading unit configured to load the substrate onto a lifter in the polishing unit and unload the substrate mounted on a substrate drying module in the cleaning unit, and the unit control panel is provided in the loading/unloading unit, the substrate table is installed for the substrate transfer test instead of the lifter at a location where the lifter is located when the polishing unit and the loading/unloading unit are assembled together and is installed for the substrate transfer test instead of the drying module at a location where the drying module is located when the cleaning unit and the loading/unloading unit are assembled together, and the test control section of the unit control panel provided in the loading/unloading unit performs the substrate transfer test by transporting the substrate placed in the loading/unloading unit to the substrate table and mounting the substrate on the substrate table by a substrate transport mechanism which is provided in the loading/unloading unit and receiving the substrate mounted on the substrate table and transporting the substrate into the loading/unloading unit by the transport mechanism.

* * * * *